(12) United States Patent
Lee et al.

(10) Patent No.: US 10,845,388 B2
(45) Date of Patent: *Nov. 24, 2020

(54) PROBE CARD DEVICE AND PROBE HEAD THEREOF

(71) Applicant: CHUNGHWA PRECISION TEST TECH. CO., LTD., Taoyuan (TW)

(72) Inventors: Wen-Tsung Lee, New Taipei (TW); Kai-Chieh Hsieh, Taoyuan (TW); Chao-Hui Tseng, New Taipei (TW); Hsien-Yu Wang, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 29 days.

This patent is subject to a terminal disclaimer.

(21) Appl. No.: 16/404,176

(22) Filed: May 6, 2019

(65) Prior Publication Data

US 2020/0166543 A1   May 28, 2020

(30) Foreign Application Priority Data

Nov. 28, 2018   (TW) .............................. 107142482 A

(51) Int. Cl.
*G01R 1/073*   (2006.01)
*G01R 31/28*   (2006.01)

(52) U.S. Cl.
CPC ..... *G01R 1/07378* (2013.01); *G01R 1/07342* (2013.01); *G01R 31/2831* (2013.01)

(58) Field of Classification Search
CPC ............ G01R 1/07378; G01R 1/07342; G01R 31/2831
See application file for complete search history.

(56) References Cited

U.S. PATENT DOCUMENTS

| | | | | |
|---|---|---|---|---|
| 5,800,184 A * | 9/1998 | Lopergolo | ........... | H05K 7/1069 439/591 |
| 6,330,164 B1 * | 12/2001 | Khandros | ............ | B23K 20/004 361/760 |
| 6,641,430 B2 * | 11/2003 | Zhou | ...................... | H01R 12/57 439/482 |
| 7,486,525 B2 * | 2/2009 | Knickerbocker | .... | G01R 1/0425 174/261 |
| 10,060,949 B2 * | 8/2018 | Li | ......................... | G01R 1/0416 |
| 10,613,117 B2 * | 4/2020 | Chen | .................. | G01R 1/06744 |
| 2020/0158756 A1 * | 5/2020 | Lee | ..................... | G01R 1/07342 |

* cited by examiner

*Primary Examiner* — Reena Aurora
(74) *Attorney, Agent, or Firm* — Li & Cai Intellectual Property (USA) Office

(57) ABSTRACT

A probe carrier of a probe card device includes an upper die unit, a lower die unit, a spacer sandwiched between the upper and lower die units, and an impedance adjusting member. The upper die unit includes a first die, a second die spaced apart from the first die, and a flexible board disposed on the second die and arranged away from the first die. The flexible board includes a plurality of penetrating holes and a circuit layer. The impedance adjusting member is disposed on the flexible board and is electrically coupled to the circuit layer. The circuit layer includes at least one plated wall arranged in at least one of the penetrating holes, a part of the flexible board having the at least one plated wall is separable from the second die by receiving an internal force.

10 Claims, 10 Drawing Sheets

PROBE CARD DEVICE AND PROBE HEAD THEREOF

CROSS-REFERENCE TO RELATED PATENT APPLICATION

This application claims the benefit of priority to Taiwan Patent Application No. 107142482, filed on Nov. 28, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a detecting device, and more particularly to a probe card device and a probe head thereof.

BACKGROUND OF THE DISCLOSURE

The operation speed of a device under test (DUT) (e.g., a semiconductor wafer) is developed to be higher and higher, so that when the DUT is tested, whether the DUT has a high frequency (or a high speed) transmission function also needs to be tested. However, each probe of a conventional probe card device is in a long and thin shape, which results in an increase in inductance value and further generates a power impedance issue, so that the conventional probe is not suitable for accurately testing the high speed transmission function of the DUT.

SUMMARY OF THE DISCLOSURE

In response to the above-referenced technical inadequacies, the present disclosure provides a probe card device and a probe head thereof which improve the conventional probe card devices.

In one aspect, the present disclosure provides a probe card device, which includes an upper die unit, an impedance adjusting member, a lower die unit, a spacer, and a plurality of conductive probes. The upper die unit includes a first die, a second die spaced apart from the first die, and a flexible board disposed on the second die and arranged away from the first die. The flexible board has a plurality of penetrating holes and a circuit layer, and the circuit layer includes at least one plated wall arranged in at least one of the penetrating holes. The impedance adjusting member is disposed on the flexible board and is electrically coupled to the circuit layer. The lower die unit is arranged at one side of the second die that is away from the first die. A distance between the lower die unit and the second die is larger than a distance between the first die and the second die. The spacer is sandwiched between the flexible board of the upper die unit and the lower die unit. The conductive probes pass through the upper die unit, the spacer, and the lower die unit. Each of the conductive probes includes an upper contacting segment and a lower contacting segment that are respectively arranged at two opposite outer sides of the upper die unit and the lower die unit. At least one of the conductive probes passes through the at least one plated wall so as to be defined as at least one matching probe. The at least one matching probe includes an abutting portion connected to the at least one plated wall, so that the at least one matching probe is electrically coupled to the impedance adjusting member through the circuit layer. When the upper contacting segment of the at least one matching probe is pressed, the abutting portion moves the at least one plated wall so as to separate a part of the flexible board from the second die.

In one aspect, the present disclosure provides a probe carrier of a probe card device, which includes an upper die unit, an impedance adjusting member, a lower die unit, and a spacer. The upper die unit includes a first die, a second die spaced apart from the first die, and a flexible board disposed on the second die and arranged away from the first die. The flexible board has a plurality of penetrating holes and a circuit layer. The impedance adjusting member is disposed on the flexible board and is electrically coupled to the circuit layer. The lower die unit is arranged at one side of the second die that is away from the first die. A distance between the lower die unit and the second die is larger than a distance between the first die and the second die. The spacer is sandwiched between the flexible board of the upper die unit and the lower die unit. The circuit layer includes at least one plated wall arranged in at least one of the penetrating holes, and a part of the flexible board having the at least one plated wall can be separated from the second die by receiving an internal force.

Therefore, the probe carrier of the probe card device in the present disclosure is provided with the flexible board that can be separated from the second die, and at least one of the conductive probes (e.g., a matching probe) positioned in the probe carrier can be electrically coupled to the impedance adjusting member on the flexible board through the circuit layer on the flexible board, thereby reducing the power impedance.

Moreover, the flexible board of the probe card device in the present disclosure is connected to (or engaged with) the matching probe, and a part of the flexible board can be separated from the second die by the matching probe, thereby preventing the related motion between the flexible board and the mating probe from generating friction that may affect the stability of electrical connection between the flexible board and the mating probe.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
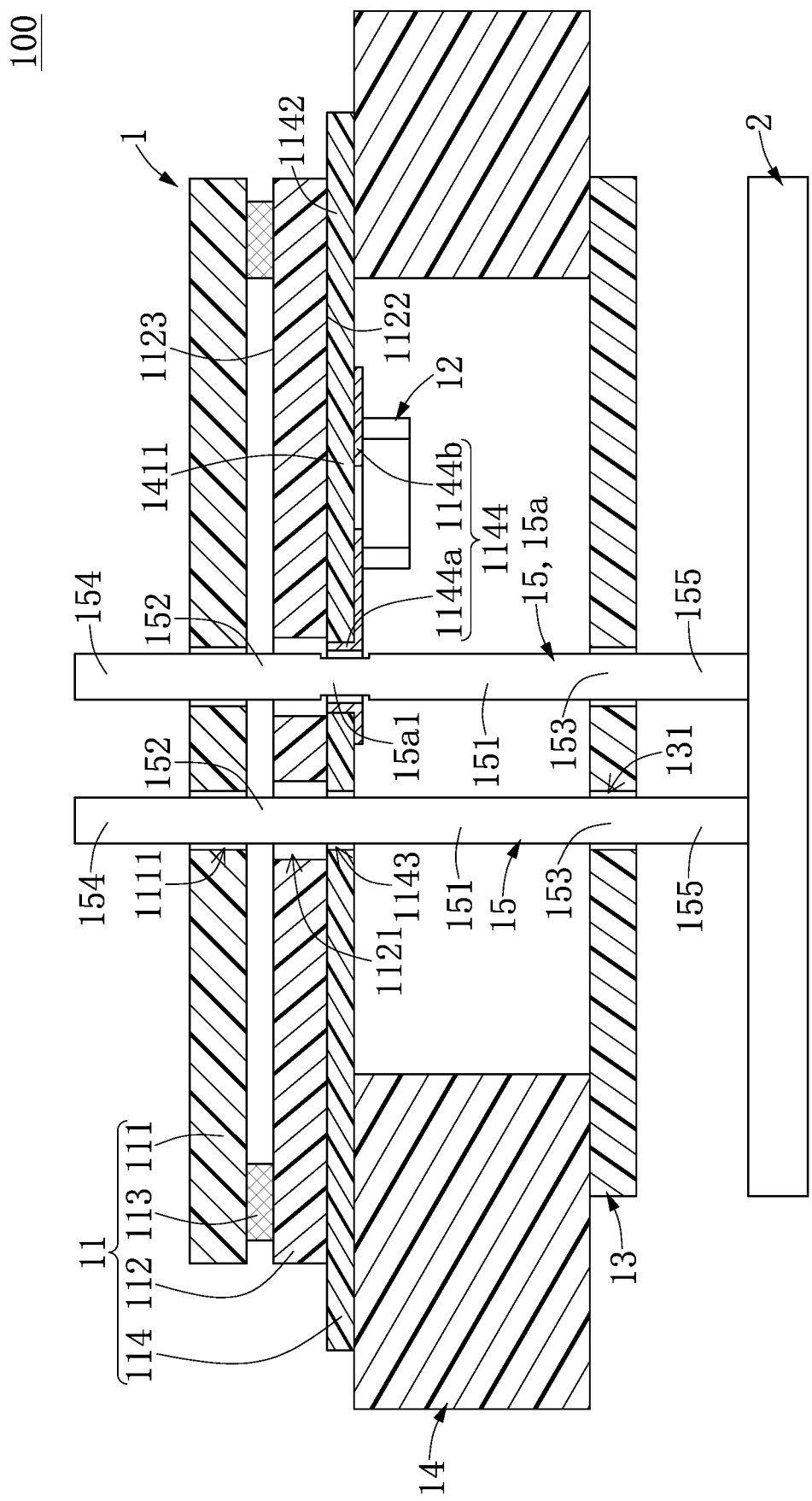
FIG. 1 is a cross-sectional view of a probe card device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 5, a first embodiment of the present disclosure provides a probe card device 100 (e.g., a vertical probe card device) that can be used to detect a high speed transmission function of a device under test (DUT) (e.g., a semiconductor wafer), but the present disclosure is not limited thereto.

Figure 2:
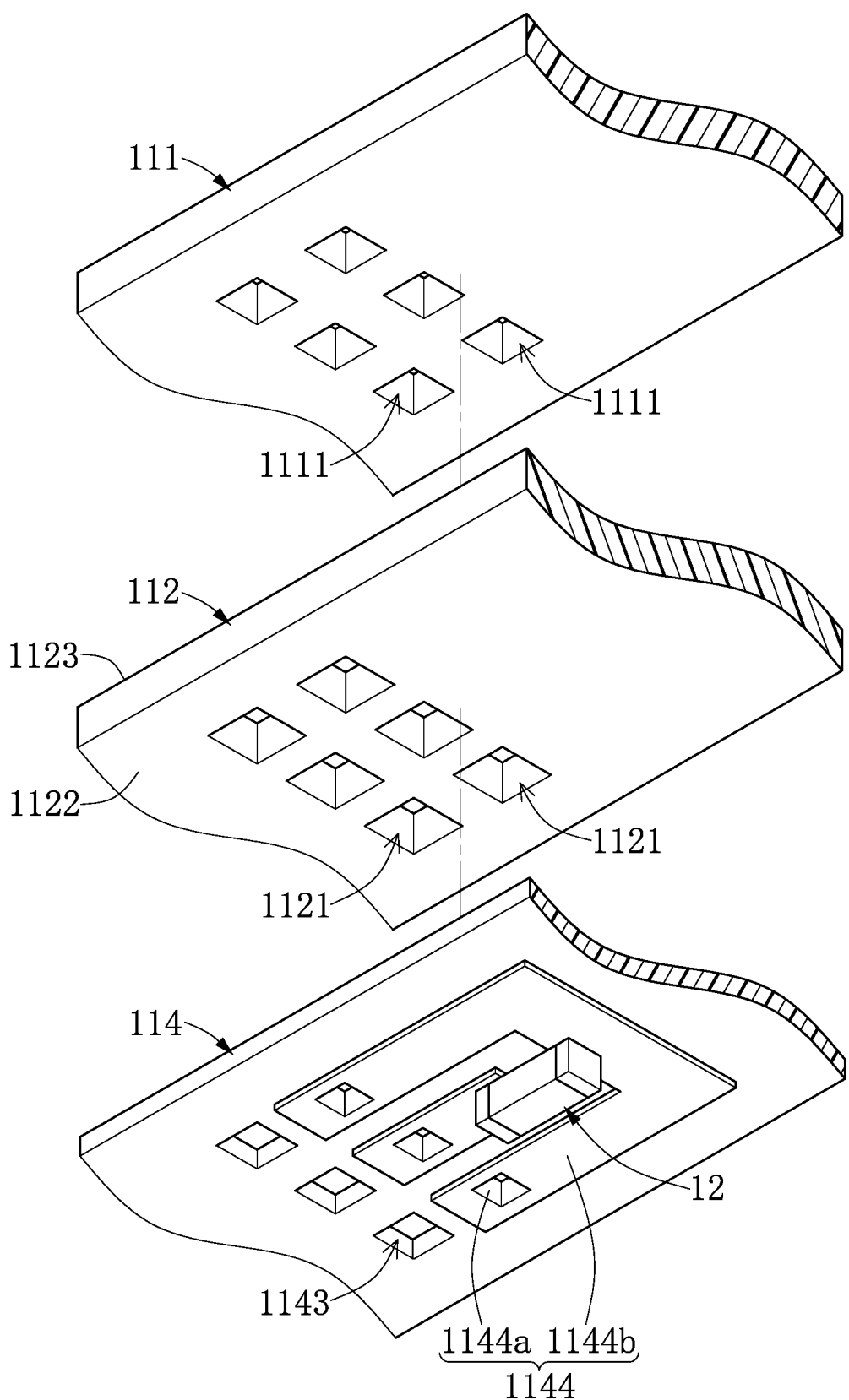
FIG. 2 is a perspective view showing an upper die unit and an impedance adjusting member of FIG. 1.

As shown in FIG. 1 and FIG. 2, the probe card device 100 includes a probe head 1 and a space transformer 2 connected to the probe head 1. The probe head 1 includes an upper die unit 11, a lower die unit 13 spaced apart from the upper die unit 11, an impedance adjusting member 12 mounted on the upper die unit 11, a spacer 14 sandwiched between the upper die unit 11 and the lower die unit 13, and a plurality of conductive probes 15, 15a passing through the upper die unit 11, the spacer 14, and the lower die unit 13.

The upper die unit 11, the lower die unit 13, the impedance adjusting member 12, and the spacer 14 in the present embodiment can be jointly defined as a probe carrier that is used for positioning the conductive probes 15, 15a. In addition, in other embodiments of the present disclosure, the probe carrier can be independently used (e.g., for sale). The following description discloses the structure of each component of the probe head 1 and the relationship of the connections between each component of the probe head 1.

As shown in FIG. 1 and FIG. 2, the upper die unit 11 includes a first die 111, a second die 112 spaced apart from the first die 111, a supporting board 113 sandwiched between the first die 111 and the second die 112, and a flexible board 114 disposed on the second die 112 and arranged away from the first die 111.

The first die 111 and the second die 112 in the present embodiment each can be a rigid board. The first die 111 has a plurality of first thru-holes 1111 formed by penetrating through the first die 111 along a thickness direction of the first die 111. The second die 112 has a plurality of second thru-holes 1121 formed by penetrating through the second die 112 along a thickness direction of the second die 112. The number and position of the penetrating holes 1112 correspond to that of the first thru-holes 1111, and a size of each of the second thru-holes 1121 is preferably larger than that of each of the first thru-holes 1111. The shape of the first thru-hole 1111 or the shape of the second thru-hole 1121 can be changed according to design requirements, such as: a rectangular shape, a square shape, a circular shape, or other shapes.

Specifically, the second die 112 includes an inner board surface 1122 (e.g., a bottom surface of the second die 112 shown in FIG. 1) and an outer board surface 1123 (e.g., a top surface of the second die 112 shown in FIG. 1) opposite to the inner board surface 1122. The inner board surface 1122 faces the lower die unit 13, and the outer board surface 1123 faces the first die 111.

The supporting board 113 in the present embodiment is ring-shaped (e.g., rectangular ring-shaped), and the supporting board 113 is sandwiched between a periphery portion of the first die 111 and a periphery portion of the second die 112, so that the first die 111 and the second die 112 can be spaced apart from each other through the supporting board 113. Moreover, the first thru-holes 1111 of the first die 111 and the second thru-holes 1121 of the second die 112 are in spatial communication with a space surroundingly defined by an inner surface of the supporting board 113.

In addition, the supporting board 113 in the present embodiment is sandwiched between the first die 111 and the second die 112, but the present disclosure is not limited thereto. For example, in other embodiments of the present disclosure, the first die 111 can be formed with a thicker periphery portion to abut against the periphery portion of the second die 112, so that the supporting board 113 can be omitted. Moreover, the upper die unit 11 can be provided with a third die to replace the supporting board 113.

The flexible board 114 in the present embodiment includes an inside portion 1141 and an outside portion 1142 arranged around the inside portion 1141. The outside portion 1142 is fixed and sandwiched between the inner board surface 1122 of the second die 112 and the spacer 14, and the inside portion 1141 is not fixed on the inner board surface 1122 of the second die 112 and can be separated from the second die 112. In other words, the upper die unit 11 in the present embodiment excludes a flexible board and a second die that cannot be separated from each other.

The flexible board 114 has a plurality of penetrating holes 1143 and a circuit layer 1144, and the penetrating holes 1143 and the circuit layer 1144 is formed on the inside portion 1141 of the flexible board 114. The position and number of the penetrating holes 1143 of the flexible board 114 correspond to that of the second thru-holes 121 of the second die 112, and the size of each of the penetrating holes 1143 is substantially equal to that of each of the first thru-hole 1111. The shape of the penetrating holes 1143 can be changed according to design requirements, such as: a rectangular shape, a square shape, a circular shape, or other shapes. It should be noted that, the first thru-hole 1111, the second thru-hole 1121, and the penetrating hole 1143 are preferably of the same shape.

Moreover, the circuit layer 1144 includes a plurality of plated walls 1144a and a connecting circuit 1144b connected to the plated walls 1144a. The plated walls 1144a are respectively arranged and plated in part of the penetrating holes 1143. In other words, the part of the penetrating holes 1143 respectively receiving the plated walls 1144a are arranged in one row on the flexible board 114. The connecting circuit 1144b in the present embodiment is disposed on a surface of the flexible board 114 (e.g., a lower surface of the flexible board 114 shown in FIG. 1) facing the lower die unit 13.

As shown in FIG. 1 and FIG. 2, the impedance adjusting member 12 in the present embodiment is a capacitor, but the present disclosure is not limited thereto. The impedance adjusting member 12 is disposed on the flexible board 14, and is electrically coupled to the circuit layer 1144. In the present embodiment, the impedance adjusting member 12 is fixed onto the circuit layer 1144, and is arranged in a space surroundingly defined by the spacer 14, but the present disclosure is not limited thereto.

As shown in FIG. 1 and FIG. 2, the spacer 14 is sandwiched between the flexible board 114 of the upper die unit 11 and the lower die unit 13, so that lower die unit 13 can be arranged at one side of the second die 112 (e.g., a lower side of the second die 112 shown in FIG. 1) that is away from the first die 111. Moreover, a distance between the lower die unit 13 and the second die 112 (or the flexible board 14) is larger than a distance between the first die 111 and the second die 112.

In the present embodiment, the lower die unit 13 is a single board, and has a plurality of thru-holes 131 corresponding in position and in number to the second thru-holes 1121, but the present disclosure is not limited thereto. For example, in other embodiments of the present disclosure, the lower die unit 13 can include two boards spaced apart from each other and a supporting board sandwiched between the two boards.

Moreover, the spacer 14 in the present embodiment is ring-shaped (e.g., rectangular ring shape), the spacer 14 is sandwiched between a periphery portion of the flexible board 114 and a periphery portion of the lower die unit 13, and the penetrating holes 1143 of the flexible board 114 and the thru-holes 131 of the lower die unit 13 are in spatial communication with a space surroundingly defined by an inner surface of the supporting board 113.

As shown in FIG. 1 and FIG. 2, the conductive probe 15, 15a (or the pin 15a1) in the present embodiment can be a round probe, a rectangular probe, a MEMS probe, or other probes. The conductive probes 15, 15a pass through the upper die unit 11, the spacer 14, and the lower die unit 13. Each of the conductive probes 15, 15a includes a middle segment 151, an upper extending segment 152 and a lower extending segment 153 respectively extending from two opposite ends of the middle segment 151, an upper contacting segment 154 extending from the upper extending segment 152 along a direction away from the middle segment 151, and a lower contacting segment 155 extending from the lower extending segment 153 along a direction away from the middle segment 151.

Moreover, in each of the conductive probes 15, 15a, the middle segment 151 is arranged in the space of the spacer 14, the upper extending segment 152 is arranged in the upper die unit 11, the lower extending segment 153 is arranged in the lower die unit 13, and the upper contacting segment 154 and the lower contacting segment 155 are respectively arranged at two opposite outer sides of the upper die unit 11 and the lower die unit 13. The space transformer 2 is fixed to the lower contacting segments 155 of the conductive probes 15, 15a, and the upper contacting segments 154 of the conductive probes 15, 15a are configured to elastically and detachably abut against the DUT.

The structures of the conductive probes 15, 15a in the present embodiments are substantially the same, and the conductive probes 15, 15a can be distinguished according to an electrical connection relative to the flexible board 114. Specifically, any one of the conductive probes 15, 15a passing through one of the plated walls 1144a is defined as a matching probe 15a. In other words, the conductive probes 15, 15a in the present embodiments includes the matching probes 15a arranged in one row, and the matching probes 15a respectively passes through and are respectively connected to the plated walls 1144a, so that the matching probes 15a are electrically coupled to the impedance adjusting member 12 through the circuit layer 1144.

As shown in FIG. 1 and FIG. 2, as the matching probes 15a are of the substantially same structure, the following description discloses the structure of just one of the matching probes 15a for the sake of brevity. The matching probe 15a includes an abutting portion 15a1 connected to the corresponding plated wall 1144a, and the abutting portion 15a1 is substantially arranged on a portion of the upper extending segment 152 adjacent to the middle segment 151, so that the matching probe 15a can be electrically coupled to the impedance adjusting member 12 by the connection of the abutting portion 15a1 and the corresponding plated wall 1144a.

Figure 3:
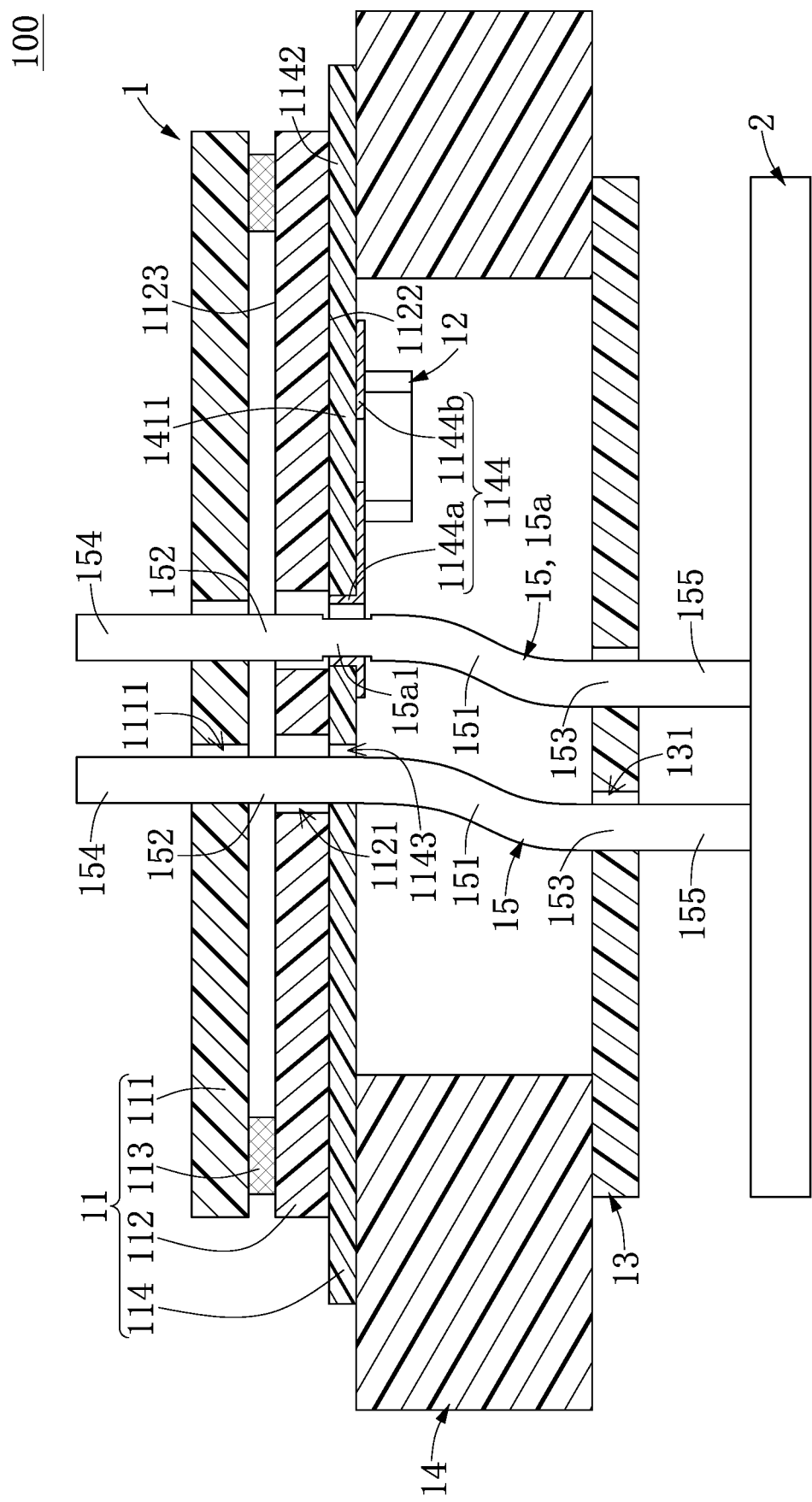
FIG. 3 is a cross-sectional view showing the probe card device of FIG. 1 after a staggered step is implemented.
Figure 4:
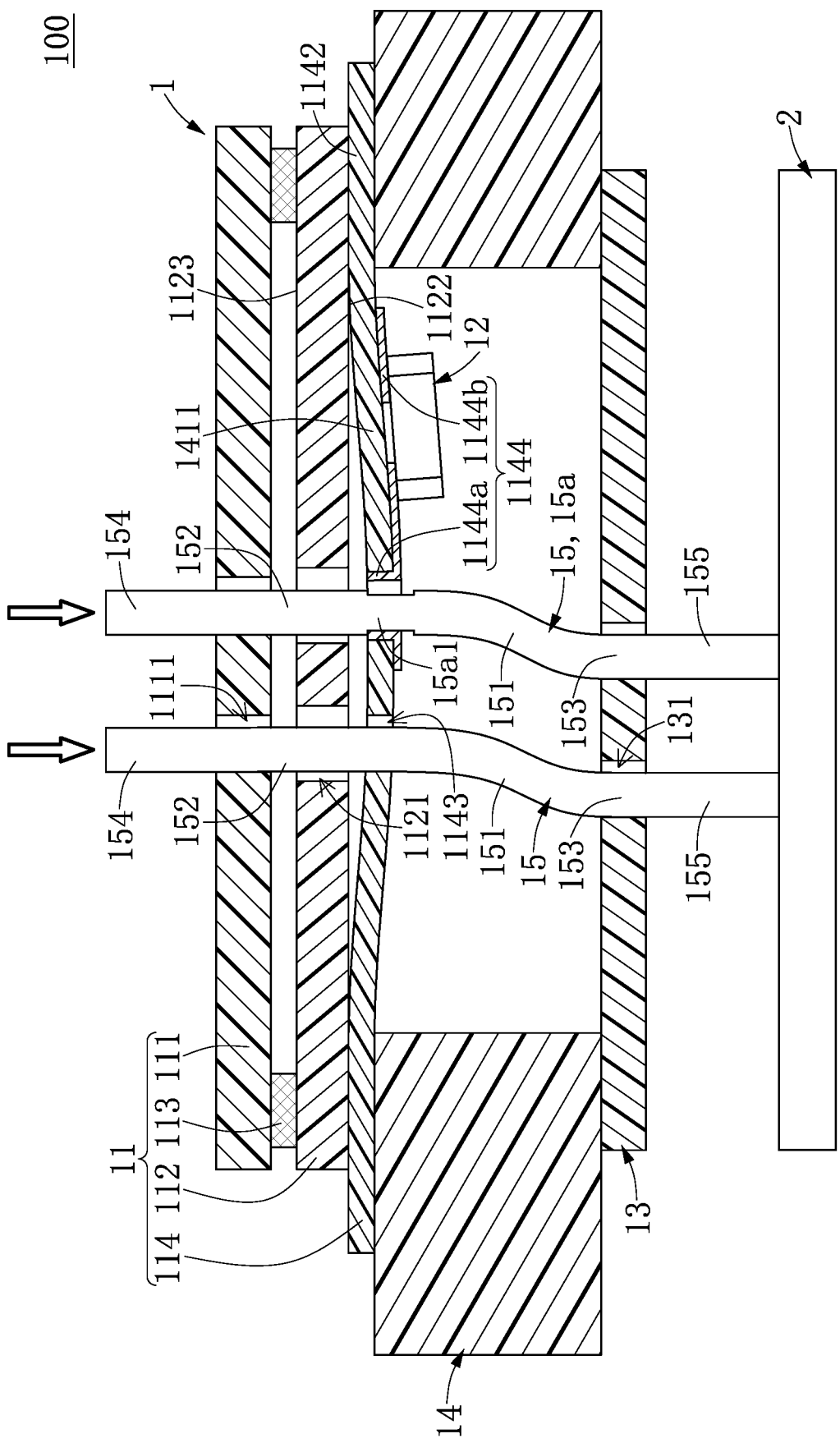
FIG. 4 is a cross-sectional view showing the probe card device of FIG. 3 used to detect a device under test.

Moreover, as shown in FIG. 3 and FIG. 4, when the upper contacting segment 154 of the matching probe 15a is pressed (e.g., when the probe card device 100 is used to detect the DUT), the abutting portion 15a1 moves the corresponding plated wall 1144a so as to separate a part of the flexible board 114 from the second die 112. Accordingly, the friction between the abutting portion 15a1 and the corresponding plated wall 1144a can be effectively reduced, so that the electrical connection between the abutting portion 15a1 and the corresponding plated wall 1144a can be maintained.

Figure 5:
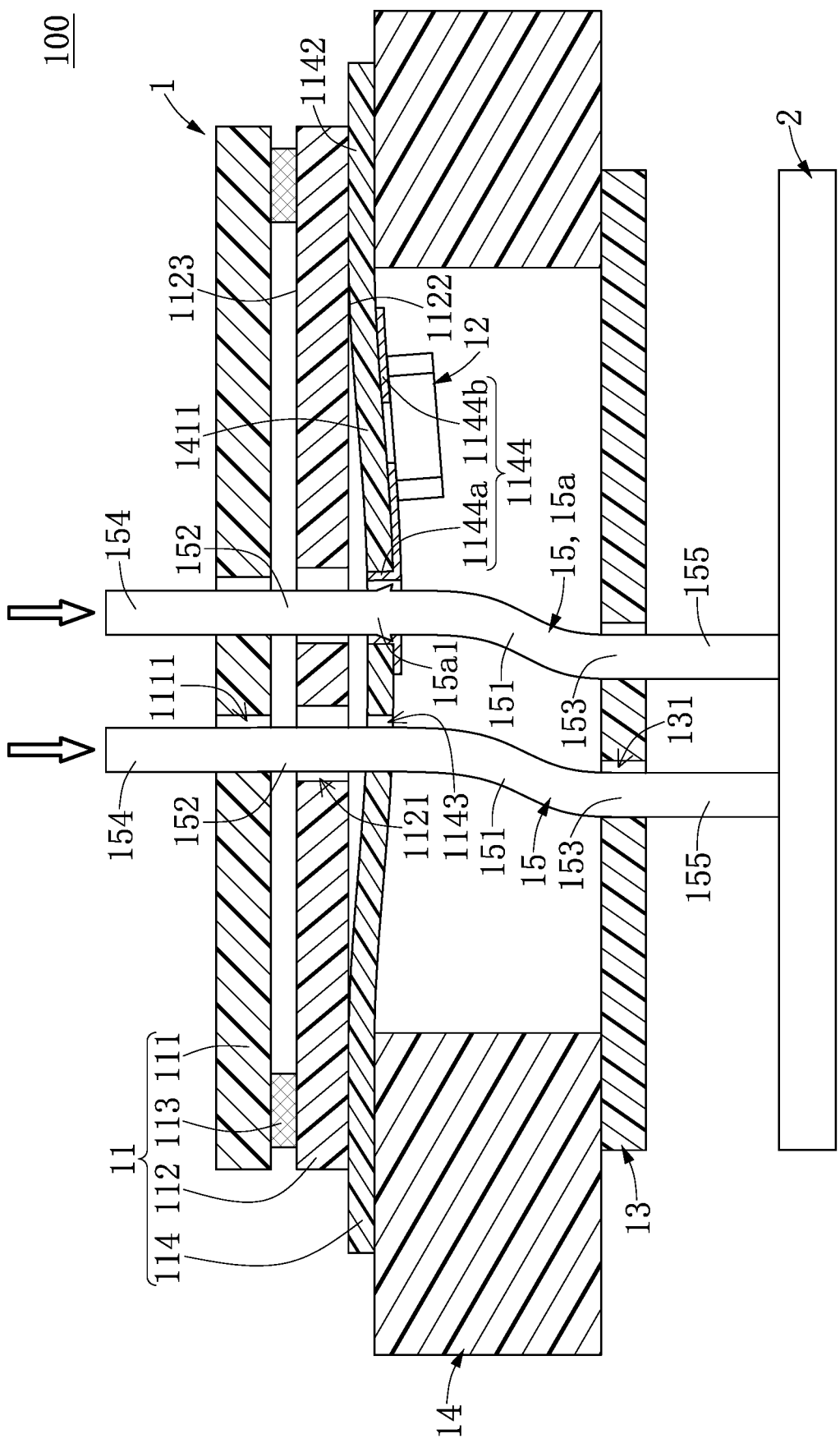
FIG. 5 is a cross-sectional view of the probe card device in another configuration according to the first embodiment of the present disclosure.

Specifically, the abutting portion 15a1 of the matching probe 15a is preferably engaged with the corresponding plated wall 1144a, and the specific structures of the abutting portion 15a1 and the corresponding plated wall 1144a can be adjusted according to design requirements (e.g., as shown in FIG. 4 or FIG. 5). In the FIG. 4 of the present embodiment, the abutting portion 15a1 of the matching probe 15a has a slot recessed in an outer surface thereof, and a width of the slot of the abutting portion 15a1 is slightly larger than a thickness of the flexible board 14.

Moreover, the upper die unit 11 and the lower die unit 13 can be staggered along a horizontal direction, so that the middle segment 151 of the matching probe 15a is elastically deformed into a curved shape, and the abutting portion 15a1 is positioned on the corresponding plated wall 1144a by the engagement between the slot of the abutting portion 15a1 and the flexible board 14. In addition, the first die 111 and the second die 112 of the upper die unit 11 can be staggered along the horizontal direction with respect to the second die 112 or the flexible board 114, so that each of the upper contacting segments 154 can be maintained orthogonal to the first die 111.

Accordingly, when the upper contacting segment 154 of the matching probe 15a is pressed (e.g., when the probe card device 100 is used to detect the DUT), the abutting portion 15a1 and the corresponding plated wall 1144a are synchronously moved, so that the friction between the abutting portion 15a1 and the corresponding plated wall 1144a can be effectively reduced, and the electrical connection between the abutting portion 15a1 and the corresponding plated wall 1144a can be firmly maintained.

It should be noted that, in other embodiments of the present disclosure, the number of the plated walls 1144a of the circuit layer 1144 and the number of the matching probes 15a of the conductive probes 15, 15a each can be at least one. Specifically, the at least one plated wall 1144a is arranged in the at least one penetrating hole 1143. In other words, the at least one plated wall 1144a is plated onto an inner wall defining the at least one penetrating hole 1143. The abutting portion 15a1 of the at least one matching probe 15a is connected to (or engaged with) the at least one plated wall 1144a, so that the at least one matching probe 15a can be electrically coupled to the impedance adjusting member 12. Accordingly, when the upper contacting segment 154 of the at least one matching probe 15a is pressed, the abutting portion 15a1 and the at least one plated wall 1144a are synchronously moved, so as to separate a part of the flexible board 114 from the second die 112.

Second Embodiment

Figure 6:
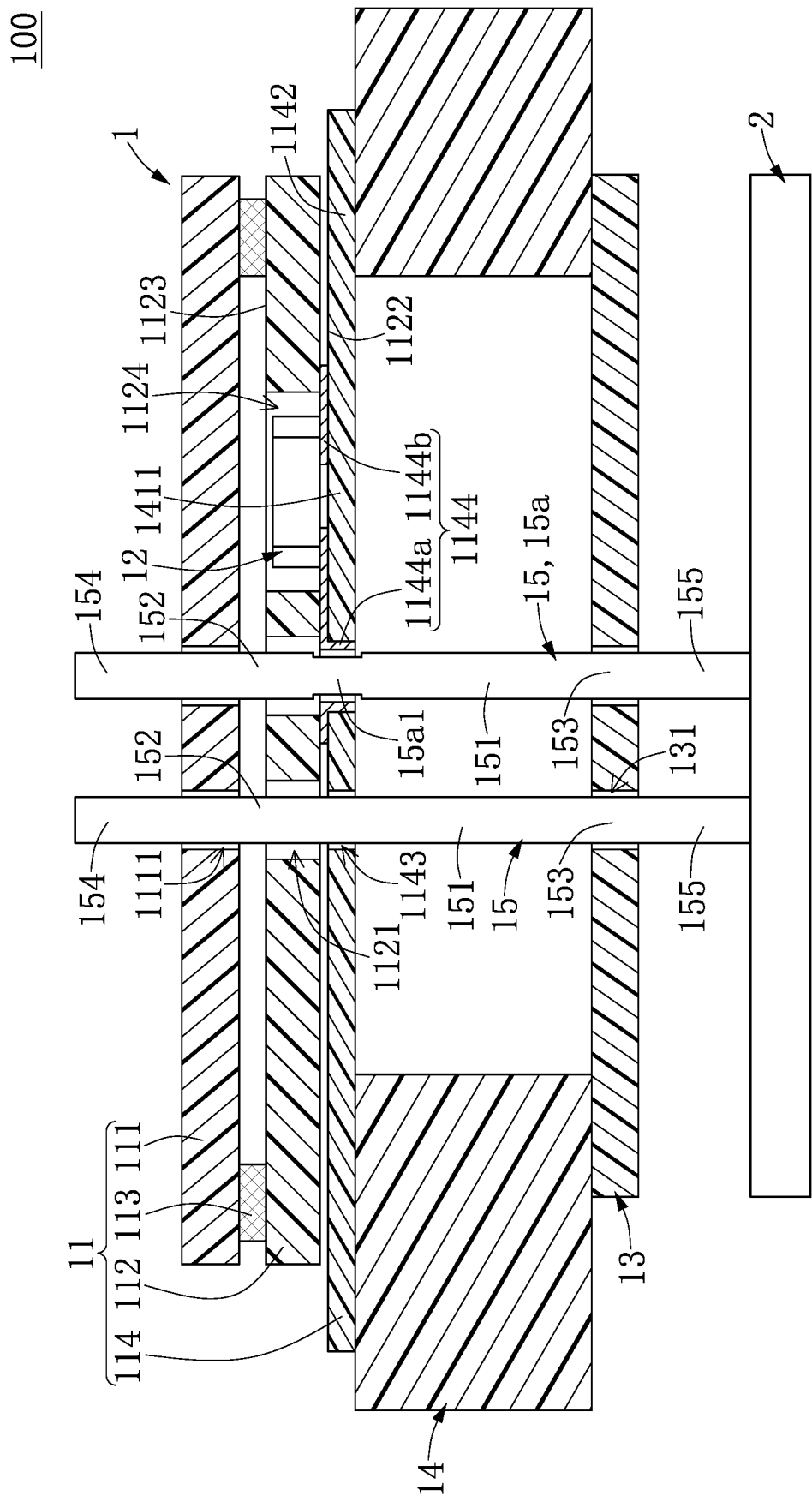
FIG. 6 is a cross-sectional view of a probe card device according to a second embodiment of the present disclosure.
Figure 7:
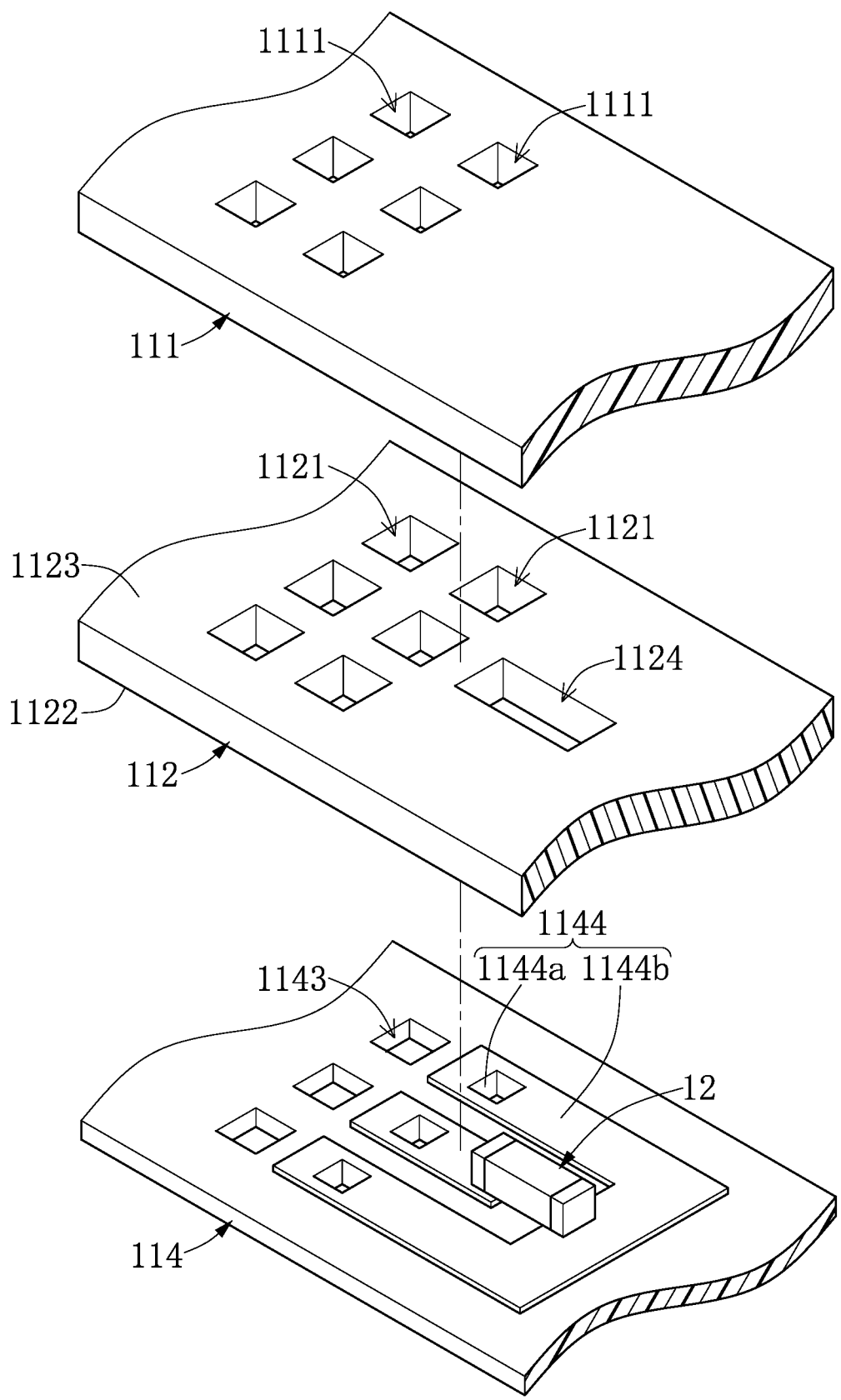
FIG. 7 is a perspective view showing an upper die unit and an impedance adjusting member of FIG. 6.

Referring to FIG. 6 and FIG. 7, a second embodiment of the present disclosure discloses a probe card device 100 that is similar to the probe card device 100 of the first embodiment, so that following description discloses only the different features of the present embodiment for the sake of brevity.

In the present embodiment, the second die 112 has an accommodating slot 1124 recessed in the inner board surface 1122, the connecting circuit 1144b of the circuit layer 1144 is disposed on a surface of the flexible board 114 (e.g., a top surface of the flexible board 114 shown in FIG. 6) facing the second die 112, and the impedance adjusting member 12 is fixed on the connecting circuit 1144b and is arranged in the accommodating slot 1124 of the second die 112.

In addition, the accommodating slot 1124 in the present embodiment is formed by penetrating through the second die 112, but in other embodiments of the present disclosure, the accommodating slot 1124 can be recessed from the inner board surface 1122, but does not penetrate through the outer board surface 1123 of the second die 112.

Third Embodiment

Figure 8:
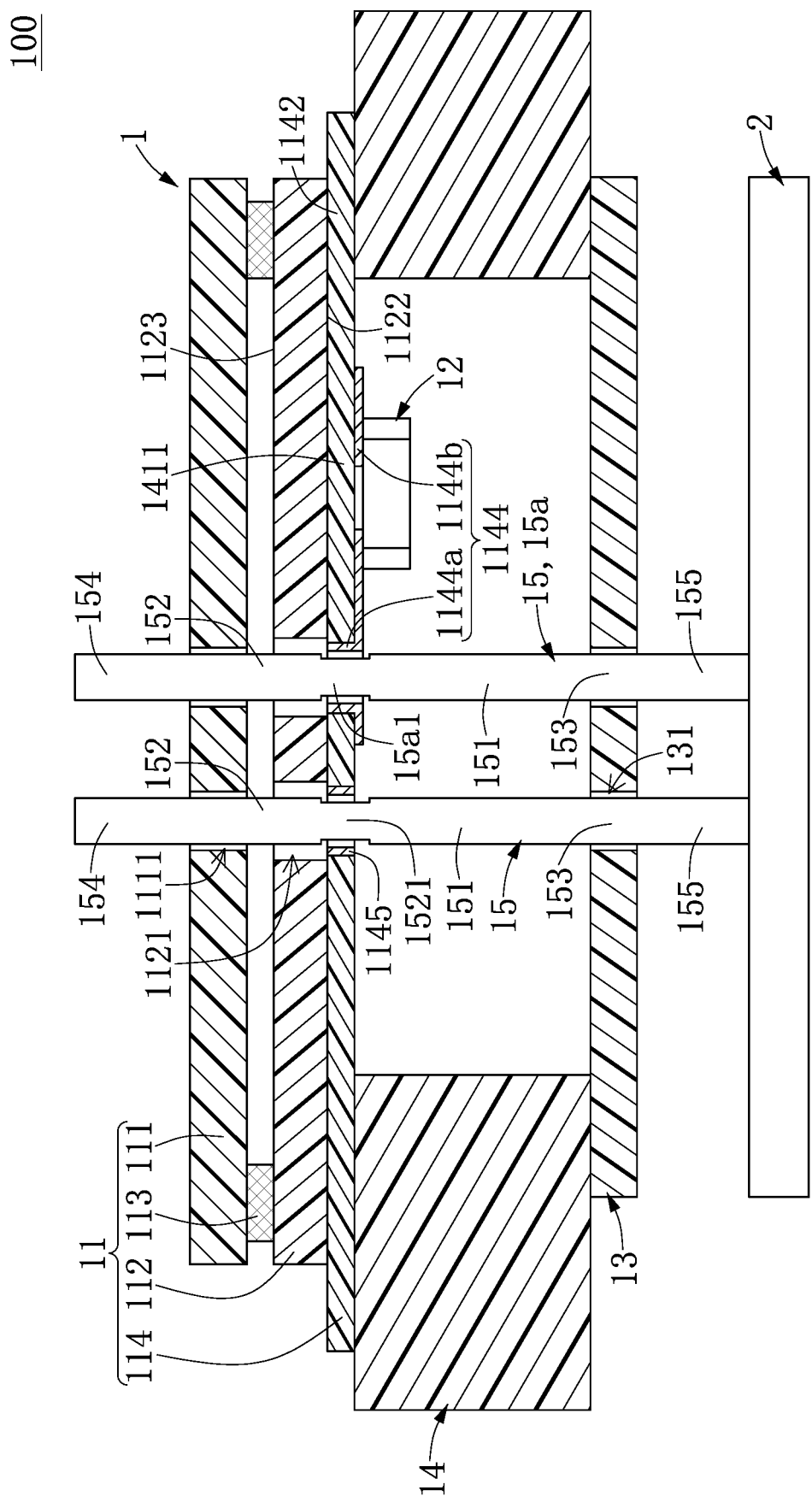
FIG. 8 is a cross-sectional view of a probe card device according to a third embodiment of the present disclosure.
Figure 9:
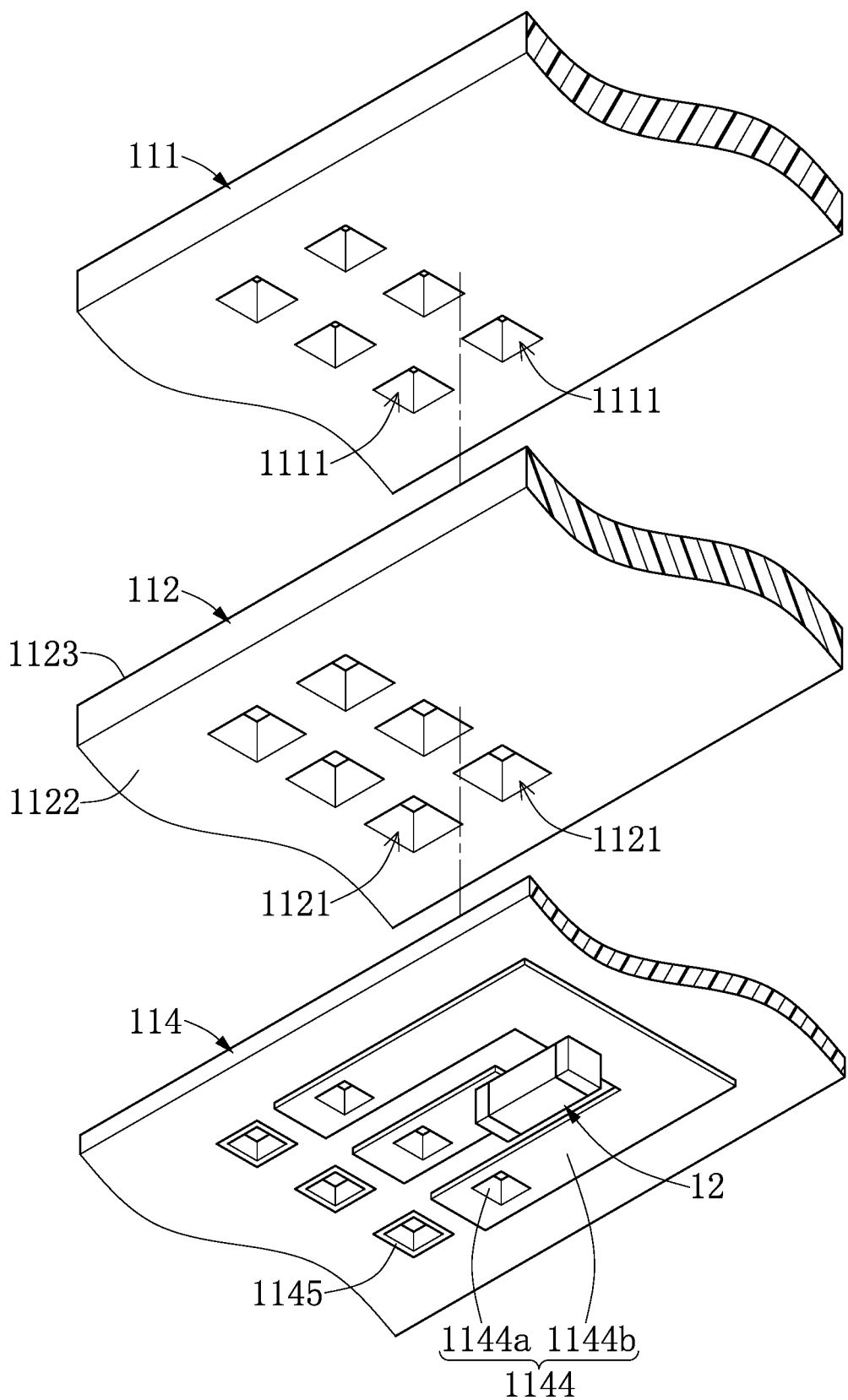
FIG. 9 is a perspective view showing an upper die unit and an impedance adjusting member of FIG. 8.
Figure 10:
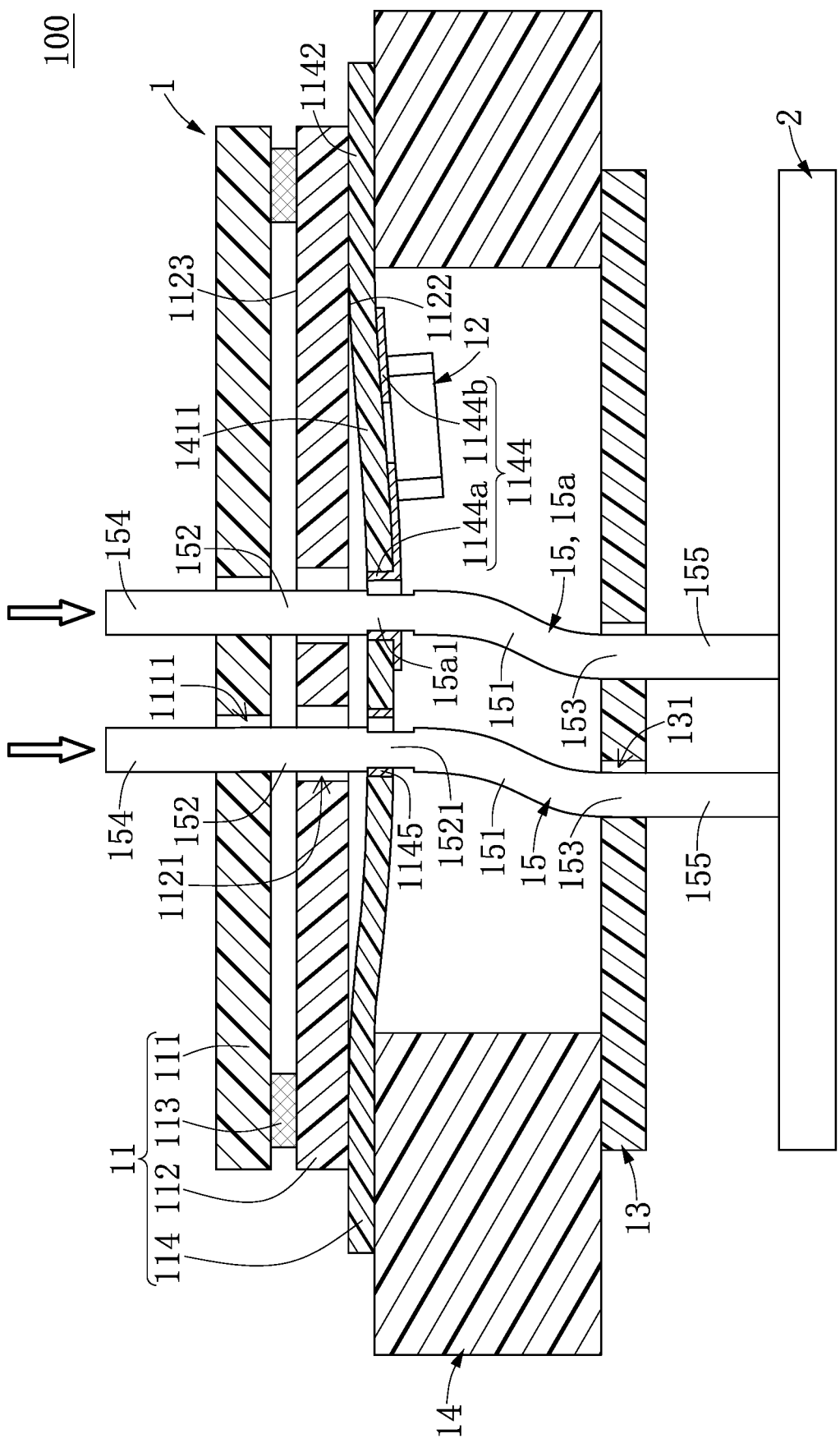
FIG. 10 is a cross-sectional view showing the probe card device of FIG. 8 used to detect a device under test after a staggered step is implemented.

Referring to FIG. 8 to FIG. 10, a third embodiment of the present disclosure discloses a probe card device 100 that is similar to the probe card device 100 of the first and second embodiments, so that following description discloses only the different features of the present embodiment for the sake of brevity.

In the present embodiment, the flexible board 114 includes a plurality of plated bodies 1145 that are respectively received in certain of the penetrating holes 1143 not receiving any of the plated walls 1144a, and the plated bodies 1145 are spaced apart from the circuit layer 1144.

Moreover, the structures of the conductive probes 15, 15a in the present embodiment are the same. That is to say, each of the conductive probes 15, 15a has an abutting portion 1521, 15a1 connected to (or engaged with) the corresponding plated body 1145 or the corresponding plated wall 1144a. Accordingly, when the probe card device 100 is used, the conductive probes 15, 15a substantially receive the same friction, so that the upper contacting segment 154 of each of the conductive probes 15, 15a can be maintained to have the same length to effectively avoid affecting the detection of the probe card device 100.

In conclusion, the probe carrier of the probe card device in the present disclosure is provided with the flexible board that can be separated from the second die, and at least one of the conductive probes (e.g., a matching probe) positioned in the probe carrier can be electrically coupled to the impedance adjusting member on the flexible board through the circuit layer on the flexible board, thereby reducing the power impedance.

Moreover, the flexible board of the probe card device in the present disclosure is connected to (or engaged with) the matching probe, and a part of the flexible board can be separated from the second die by the matching probe, thereby preventing the related motion between the flexible board and the mating probe from generating friction that may affect the stability of electrical connection between the flexible board and the mating probe.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe card device, comprising:
   an upper die unit including a first die, a second die spaced apart from the first die, and a flexible board disposed on the second die and arranged away from the first die, wherein the flexible board has a plurality of penetrating holes and a circuit layer, and the circuit layer includes at least one plated wall arranged in at least one of the penetrating holes;
   an impedance adjusting member disposed on the flexible board and electrically coupled to the circuit layer;
   a lower die unit arranged at one side of the second die that is away from the first die, wherein a distance between the lower die unit and the second die is larger than a distance between the first die and the second die;
   a spacer sandwiched between the flexible board of the upper die unit and the lower die unit; and
   a plurality of conductive probes passing through the upper die unit, the spacer, and the lower die unit, wherein each of the conductive probes includes an upper contacting segment and a lower contacting segment that are respectively arranged at two opposite outer sides of the upper die unit and the lower die unit, wherein at least one of the conductive probes passes through the at least one plated wall so as to be defined as at least one matching probe, the at least one matching probe includes an abutting portion connected to the at least one plated wall, so that the at least one matching probe is electrically coupled to the impedance adjusting member through the circuit layer, and wherein when the upper contacting segment of the at least one matching probe is pressed, the abutting portion moves the at least one plated wall so as to separate a part of the flexible board from the second die.

2. The probe card device according to claim 1, wherein the abutting portion of the at least one matching probe is engaged with the at least one plated wall, so that when the upper contacting segment of the at least one matching probe is pressed, the abutting portion and the at least one plated wall are synchronously moved.

3. The probe card device according to claim 1, wherein the upper die unit and the lower die unit are staggered, so that the at least one matching probe is elastically deformed into a curved shape, and wherein the abutting portion is fixed to the at least one plated wall, so that when the upper contacting segment of the at least one matching probe is pressed, the abutting portion and the at least one plated wall are synchronously moved.

4. The probe card device according to claim 1, wherein the flexible board includes an inside portion and an outside portion arranged around the inside portion, the outside portion is fixed and sandwiched between the second die and the spacer, and the inside portion is not fixed on the second die and is separable from the second die.

5. The probe card device according to claim 1, wherein the circuit layer includes a connecting circuit connected to the at least one plated wall and is disposed on a surface of the flexible board facing the lower die unit, and the impedance adjusting member is fixed on the connecting circuit and is arranged in a space surroundingly defined by the spacer.

6. The probe card device according to claim 1, wherein the second die has an accommodating slot, the circuit layer includes a connecting circuit connected to the at least one plated wall, the connecting circuit is disposed on a surface of the flexible board facing the second die, and the impedance adjusting member is fixed on the connecting circuit and is arranged in the accommodating slot.

7. The probe card device according to claim 1, wherein the number of the at least one plated wall of the flexible board is more than one, the plated walls are respectively arranged in part of the penetrating holes, the at least one matching probe of the conductive probes is more than one, and the matching probes are arranged in one row, and wherein the matching probes respectively pass through and connected to the plated walls, so that the matching probes are electrically coupled to the impedance adjusting member through the circuit layer.

8. The probe card device according to claim 1, wherein the upper die unit includes a supporting board sandwiched between the first die and the second die, the probe card device further includes a space transformer fixed to the lower contacting segments of the conductive probes, and the upper contacting segments of the conductive probes are configured to elastically and detachably abut against a device under test (DUT).

9. A probe carrier of a probe card device, comprising:
an upper die unit including a first die, a second die spaced apart from the first die, and a flexible board disposed on the second die and arranged away from the first die, wherein the flexible board has a plurality of penetrating holes and a circuit layer;
an impedance adjusting member disposed on the flexible board and electrically coupled to the circuit layer; and
a lower die unit arranged at one side of the second die that is away from the first die, wherein a distance between the lower die unit and the second die is larger than a distance between the first die and the second die;
a spacer sandwiched between the flexible board of the upper die unit and the lower die unit;
wherein the circuit layer includes at least one plated wall arranged in at least one of the penetrating holes, and a part of the flexible board having the at least one plated wall is separable from the second die by receiving an internal force.

10. The probe carrier of the probe card device according to claim 9, wherein the flexible board includes an inside portion and an outside portion arranged around the inside portion, the outside portion is fixed and sandwiched between the second die and the spacer, and the inside portion is not fixed on the second die and is separable from the second die.

* * * * *